US009297870B2

(12) United States Patent
Van Den Brink

(10) Patent No.: US 9,297,870 B2
(45) Date of Patent: Mar. 29, 2016

(54) MAGNETIC RESONANCE EXAMINATION WITH INSTRUMENT DETECTION

(75) Inventor: Johan Samuel Van Den Brink, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 507 days.

(21) Appl. No.: 13/700,137

(22) PCT Filed: May 19, 2011

(86) PCT No.: PCT/IB2011/052195
§ 371 (c)(1),
(2), (4) Date: Nov. 27, 2012

(87) PCT Pub. No.: WO2011/148300
PCT Pub. Date: Dec. 1, 2011

(65) Prior Publication Data
US 2013/0088229 A1   Apr. 11, 2013

(30) Foreign Application Priority Data
May 27, 2010 (EP) ..................... 10164115

(51) Int. Cl.
G01V 3/00 (2006.01)
G01R 33/385 (2006.01)
G01R 33/28 (2006.01)
G01R 33/561 (2006.01)
G01R 33/54 (2006.01)

(52) U.S. Cl.
CPC .......... *G01R 33/3852* (2013.01); *G01R 33/285* (2013.01); *G01R 33/54* (2013.01); *G01R 33/5613* (2013.01); *G01R 33/288* (2013.01)

(58) Field of Classification Search
CPC .................................. G01R 33/3852

USPC .......................................... 324/309
See application file for complete search history.

(56) References Cited

U.S. PATENT DOCUMENTS 7,050,855 B2   5/2006   Zeijlemaker et al.
7,170,290 B2   1/2007   Miyoshi
(Continued)

FOREIGN PATENT DOCUMENTS

WO   2008146228 A1   12/2008

OTHER PUBLICATIONS

Hansjorg Graf, Gunter Steidle, Ptros Martirosian, Ulrike A. Lauer and Fritz Schick. "Effects on MRI due to altered rf polarization near conductive implants or instruments". Medical Physics, vol. 33, issue 1, p. 124. Section on Experimental Radiology, University Hospital Tubingen, Germany. 2005.

(Continued)

*Primary Examiner* — Rodney Fuller

(57) ABSTRACT

An magnetic resonance examination system for examination of an object comprises an RF system to generate an RF transmission field and gradient system to generate temporary magnet gradient fields. A control module includes a sequence controller to control the RF system and the gradient system to produce acquisition sequences including RF pulses and magnetic gradient pulses to generate magnetic resonance signals. The sequence controller is configured to produce an detection scan including a steady state gradient echo acquisition sequence to generate steady state gradient echo signals and an RF spoiled echo acquisition sequence to produce RF spoiled echo signals. The control module further including an analysis unit to compare the gradient echo signals to the RF spoiled echo signals and for detection of an instrument in the object from the comparison of the gradient echoes and the RF spoiled echoes.

5 Claims, 2 Drawing Sheets

(56) References Cited

U.S. PATENT DOCUMENTS

| | | |
|---|---|---|
| 7,292,039 B1 | 11/2007 | Laub et al. |
| 7,561,915 B1 | 7/2009 | Cooke et al. |
| 7,759,934 B2 | 7/2010 | Miyoshi |
| 9,014,782 B2 | 4/2015 | Miyoshi |
| 2005/0085863 A1 | 4/2005 | Brodnick et al. |
| 2006/0025820 A1 | 2/2006 | Phillips et al. |
| 2007/0247148 A1* | 10/2007 | Den Boer et al. ............. 324/301 |
| 2007/0265685 A1 | 11/2007 | Zeijlemaker |
| 2011/0043205 A1 | 2/2011 | Graesslin et al. |
| 2011/0101979 A1* | 5/2011 | Wiesinger et al. ............ 324/309 |
| 2014/0303482 A1* | 10/2014 | Santini et al. ................. 600/411 |
| 2015/0008918 A1* | 1/2015 | Nittka ........................... 324/309 |

OTHER PUBLICATIONS

HH Quick, H. Kuehl, G. Kaiser, S. Bosk, JF Debatin, ME Ladd. "Inductively coupled stent antennas in MRI". Magnetic Resonance in Medicine Nov. 2002, 48(5): 781-790.

Harald H. Quick, Michael O. Zenge, Hilmar Kuehl, Gernot Kaiser, Stephanie Aker, Sandra Massing, Silke Bosk and Mark E. Ladd. "Interventional Magnetic Resonance Angiography with No Strings Attached: Wireless Active Catheter Visualization". Magnetic Resonance in Medicine 53:446-455 (2005).

Quick et al "Interventional Magnetic Resonance Angiography with No Strings Attached . . . " Magnetic Resonance in Medicine vol. 53, p. 446-455 (2005).

Li et al "The Influence of Metallic Body on MRI Examination" International Journal of Medical Radiology vol. 32, No. 1 (no English language available), (2009).

Graf et al "Effects on MRI due to Altered rf Polarizaition Near Conductive Implants or Instruments" Medical Physics, vol. 33 No. 1 p. 124 (2006).

Yan et al "Research Progress about Reducing Artifacts . . . " International Journal of Stomatology, vol. 35, No. 6, p. 712-714 (no English language available), (2008).

* cited by examiner

MAGNETIC RESONANCE EXAMINATION WITH INSTRUMENT DETECTION

This application is a national stage application under 35 U.S.C. §371 of International Application No. PCT/IB2011/052195 filed on May 19, 2011 and published in the English language on Dec. 1, 2011 as International Publication No. WO/2011/148300, which claims priority to European Application No. 10164115.7 filed on May 27, 2010, the entire disclosures of which are incorporated herein by reference.

FIELD OF THE INVENTION

The invention pertains to a magnetic resonance examination system which includes the function to identify an implanted instrument in the object to be examined. It is generally known that implants, such as in the form of implanted medical devices such as pacemakers or neurostimulators may give rise to hazardous situations in a magnetic resonance examination system. Such a magnetic resonance examination system is known from the ISMRM 2009 abstract 306 'Detecting unsafe device coupling using reversed polarization'.

BACKGROUND OF THE INVENTION

The known magnetic resonance examination system comprises a 32-ring birdcage coil which employs so-called reverse polarization in which a right handed circularly polarized RF field is used for transmission and left handed circularly polarized RF field is used for reception. When a coupled wire is present in the field of view of the birdcage coil, the wire generates a secondary linearly polarized field proportional to the current through the wire. The forward-polarized component of this induced linearly polarized field produces a localized magnetic resonance signal proportional to its coupling.

SUMMARY OF THE INVENTION

An object of the invention is to provide a magnetic resonance examination system with safe detection of an instrument such that only a marginal modification of the magnetic resonance examination system is required.

This object is achieved according to the invention by a magnetic resonance examination system comprising an RF system to generate an RF transmission field, a gradient system to generate temporary magnetic gradient fields, a control module including a sequence controller to control the RF system and the gradient system to produce acquisition sequences including RF pulses and magnetic gradient pulses to generate magnetic resonance signals, wherein the sequence controller is configured to produce an detection scan including a steady state gradient echo acquisition sequence to generate steady state gradient echo signals and an RF spoiled echo acquisition sequence to produce RF spoiled echo signals, the control module further including an analysis unit
to compare the gradient echo signals to the RF spoiled echo signals and
for detection of an instrument in the object from the comparison of the gradient echoes and the RF spoiled echoes.

The insight of the present invention is that the differences between the responses of a gradient echo acquisition sequence and an RF spoiled gradient echo acquisition sequence are accurate and sensitive indicators for unexpected RF coupling of the RF fields with an instrument. The instrument is for example an implanted instrument (implant) in the patient's body. Detection of such an implanted instrument entails to establish the actual presence of the instrument in the patient's body. Another example of an instrument is an interventional instrument such as a catheter or an endoscope that is inserted into the patient's body. On the basis of the RF coupling of the interventional instrument with the RF-fields, the position of the interventional instrument can be tracked. That is, in the example of the interventional instrument the detection entails detection of its presence and indication of its position as the interventional instrument is moved within the patient's body. The invention does not require hardware adaptations to the magnetic resonance examination system. The detection according to the invention has near zero background at 1.5 T and at 3.0 T in most of the abdominal space. Notably, the background suppression at 3.0 T is markedly better than what is achieved by the known magnetic resonance examination system on the basis of reverse polarize or anti-quadrature RF fields. Also, the detection method according to the invention applies very low $B_1$, $B_1$ rms and gradient slew rate values to prevent hazardous interactions between a potentially present device and body tissue; thus it is inherently safe.

These and other aspects of the invention will be further elaborated with reference to the embodiments defined in the dependent claims.

In a preferred embodiment of the magnetic resonance examination system of the invention, the detection scan is incorporated in a spatial low-resolution survey scan. Such a survey scan is often made to adjust several settings of the magnetic resonance examination system for the particular object, viz. patient to be examined. The detection scan is preferably designed to have a sensitivity region that encompasses the patient access space of the magnetic resonance examination system. The sensitivity region is the region from which the detection scan generates magnetic resonance signals with an appreciable signal amplitude or signal-to-noise ration that enables to detect or track the instrument. The patient access space is the region in the magnetic resonance examination system that is accessible to the patient. Notably, the examination zone, i.e. the region where the main magnetic field and the gradient magnetic fields are spatially uniform to such a degree that diagnostic quality magnetic resonance images can be made, is included within the patient access space. The detection scan is able to encompass the patient access space e.g. by setting the sensitivity region of the detection scan to be 500-600 mm³. In another implementation the sensitivity region of the detection scan extends to most of the region within the 0.5 mT contour of the magnetic resonance examination system. Notably, the field of view of the detection scan captures the region within the 0.5 mT contour at the side of the magnetic resonance examination system from where the patient is moved into the examination zone. For example, the sensitivity region of the detection scan can be set as the field of view of the detection scan as determined by the k-space sampling of the acquisition sequences of the detection scan. However the sensitivity region can be larger than the field of view in the event that a low level of folding artifacts can be accepted in the detection of the instrument. The survey scan may also be employed to obtain receive spatial sensitivity profiles of the RF receiver antennae (coils) of the RF system. These spatial sensitivity profiles are employed in parallel imaging techniques, like SENSE, to unfold aliasing due to undersampling. This survey scan is generally designed to operate with very low specific absorption rate (SAR) and low peripheral nerve stimulation (PNS). This enables safe detection of potentially hazardous implants.

Applying low $B_1$, $B_1$ rms and slew rates prevent potential local tissue heating or vibrations from such a potentially unsafe implant. Moreover, the survey scan does not involve many RF excitation and refocusing RF pulses and involves only low slew rate gradient magnetic field pulses. Thus, the survey scan on the one hand can accommodate the detection scan to assess the patient to be examined on any implants and on the other hand, generally the survey scan does not induce hazardous situations in the event a patient with an implant is scanned.

In a further aspect of the invention, the detection scan involves comparison of twice the gradient echo signal level and the RF spoiled echo signal level, or the RF spoiled echo signal level at a preset flip angle and the RF spoiled echo signal at twice the present flip angle of the RF spoiled echo signal level and the gradient echo signal level at the flip angle equal to the Ernst angle. Notably at low flip angle of the repeated refocusing RF pulses of both the steady state gradient echo and the RF spoiled echo signals, these alternatives produce a minimum signal in the event there is no coupling to an implant, i.e. at nominal flip angle. Good results are achieved with a flip angle of less than 10°. Thus, these alternatives each produce a low background signal if no implant is present or in regions where there is no interventional instrument, so that these alternatives provide highly sensitive implant detection or instrument tracking when the flip angle is enhanced by RF coupling.

Particularly suitable acquisition sequences for the detection scan are T1-FFE and FFE sequences.

The invention further relates to a method of detecting an implant as defined by a method of detecting an implant using magnetic resonance signals, the method including; to produce a detection scan including a steady state gradient echo acquisition sequence to generate steady state gradient echo signals and an RF spoiled echo acquisition sequence to produce RF spoiled echo signals, and to compare the gradient echo signals to the RF spoiled echo signals for detection of the implant in the object from the comparison of the gradient echoes and the RF spoiled echoes. The method of the invention achieves safe detection of an implant in the patient to be examined without the need of extensive modification of a conventional magnetic resonance examination system. Notably, the method of the invention achieves the technical result whether the patient to be examined carries an implant and therefore may not be safe to be examined using magnetic resonance imaging.

The invention further relates to a computer programme including instructions to produce a detection scan including a steady state gradient echo acquisition sequence to generate steady state gradient echo signals and an RF spoiled echo acquisition sequence to produce RF spoiled echo signals, and to compare the gradient echo signals to the RF spoiled echo signals for detection of the implant in the object from the comparison of the gradient echoes and the RF spoiled echoes. The computer programme of the invention can be provided on a data carrier such as a CD-rom disk or a USB memory stick, or the computer programme of the invention can be downloaded from a data network such as the world-wide web. When installed in the computer included in a magnetic resonance imaging system the magnetic resonance imaging system is enabled to operate according to the invention and achieve safe detection of an implant in the patient to be examined without the need of extensive modification of a conventional magnetic resonance examination system.

These and other aspects of the invention will be elucidated with reference to the embodiments described hereinafter and with reference to the accompanying drawing wherein.

DETAILED DESCRIPTION OF THE PREFERRED EMBODIMENTS

Figure 1:
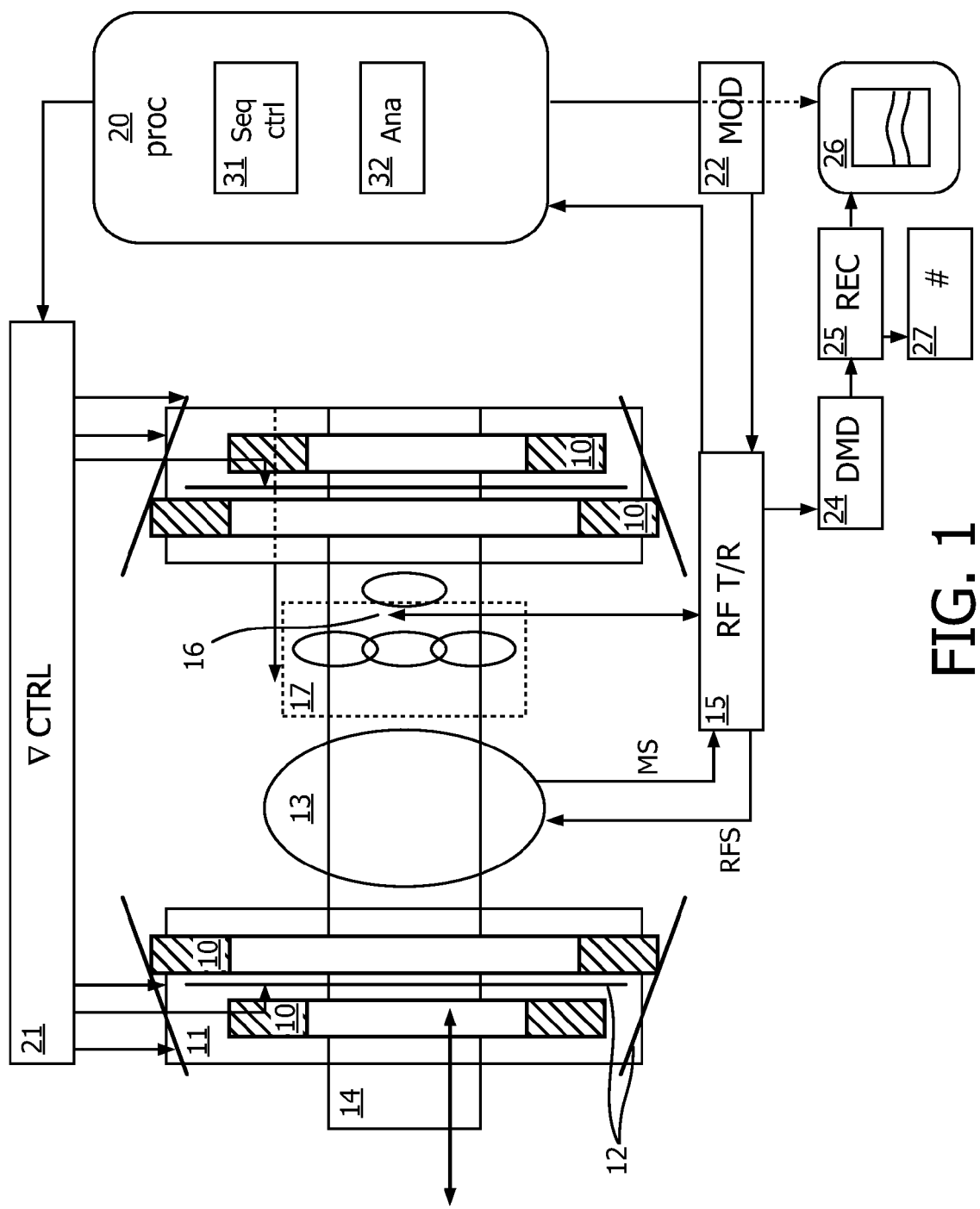
FIG. 1 shows diagrammatically a magnetic resonance imaging system in which the invention is used.

FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energized by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The RF system of the magnetic resonance imaging system includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving and/or transmission coils 16. For example, surface coils 16 can be used as receiving and/or transmission coils. Such surface coils have a high sensitivity in a comparatively small volume. A demodulator is provided in the RF system. The receiving coils, such as the surface coils, are connected to the demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the RF system includes a modulator 22 and the transmission and receiving circuit 15 is connected to the modulator 22. The modulator 22 and the transmission and receiving circuit 15 activate the transmission coil 13 so as to transmit the RF excitation and refocusing pulses. Magnetic resonance signal data received by the surface coils 16 are transmitted to the transmission and receiving circuit 15 and control signals (e.g. to tune and detune the surface coils) are sent to the surface coils by the control module 20.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control module 20, for example in the form of a computer which includes a (micro) processor. The control module 20 controls, by way of a sequence controller 31, the execution of the RF excitations and the application of the temporary gradient fields. Notably, the control module is configured or programmed to perform the detection scan which is played out to identify an implant or to track an interventional instrument. To this end, the computer program according to the invention is loaded, for example, into the control unit 20 and the reconstruction unit 25. Further, the control module is further provided with a an analysis unit 32. The analysis unit 32 incorporates the arithmetic function which compares the gradient echo signals to the RF spoiled echo signals, notably that are generated in the detection scan. The analysis unit 32 compares the signal levels of the steady-state gradient echo and RF spoiled gradient echo signals. According to one embodiment, the actual presence of an implant is detected on the basis of the comparison of difference signals from the imaging volume, and an detection signal (IS) is applied to the monitor 26 so as to provide an indication of the identified implant to the operator. It is also possible that the operator reviews the presented image data for signal enhancements. Alternatively, the detection signal (IS) may represent the position of e.g. of the tip of an interventional instrument. On the basis of the detection signal the actual position of the interventional instrument can be shown in the magnetic resonance image.

According to the invention, a potentially hazardous implant is detected or an interventional instrument is tracked on the basis of subtraction of the steady-state gradient echo and RF spoiled gradient echo signals. More in particular the difference between signals from and FFE-sequence and a $T_1$-FFE sequence is employed. For short $T_E/T_R$ the RF spoiled signal intensity is:

$$S_{sp} = \rho \sin\alpha \frac{1-E_1}{1-E_1\cos\alpha}$$

and the steady-state signal intensity is:

$$S_{ss} = \rho \frac{1 + \frac{1\cos\alpha - a}{\sqrt{a^2-b^2}}}{1+\cos\alpha}\sin\alpha,$$

where $$a = \frac{1 - E_1 E_2^2 + \cos\alpha(E_2^2 - E_1)}{1 - E_1}$$

$$b = (1+\cos\alpha)E_2 \text{ and } E_i = e^{-\frac{T_R}{T_i}}.$$

The spin density is denoted by $\rho$ and $\alpha$ is the flip angle. For low values of the flip angle these signal intensities are in fair approximation:

$$S_{sp}(\alpha) = \rho\alpha$$

$$S_{ss}(\alpha) = \frac{1}{2}\rho\alpha.$$

In order to compare these signals and achieve a low level of background signal when no implant is present or in a region where there is no interventional instrument the following alternatives are available:

$$S_{n2\alpha} = S_{ss}(2\alpha) - S_{sp}(\alpha);$$

$$S_{2n\alpha} = 2S_{ss}(\alpha) - S_{sp}(\alpha);$$

$$S_{n\alpha} = S_{ss}(\alpha) - S_{sp}(\alpha).$$

Figure 2:
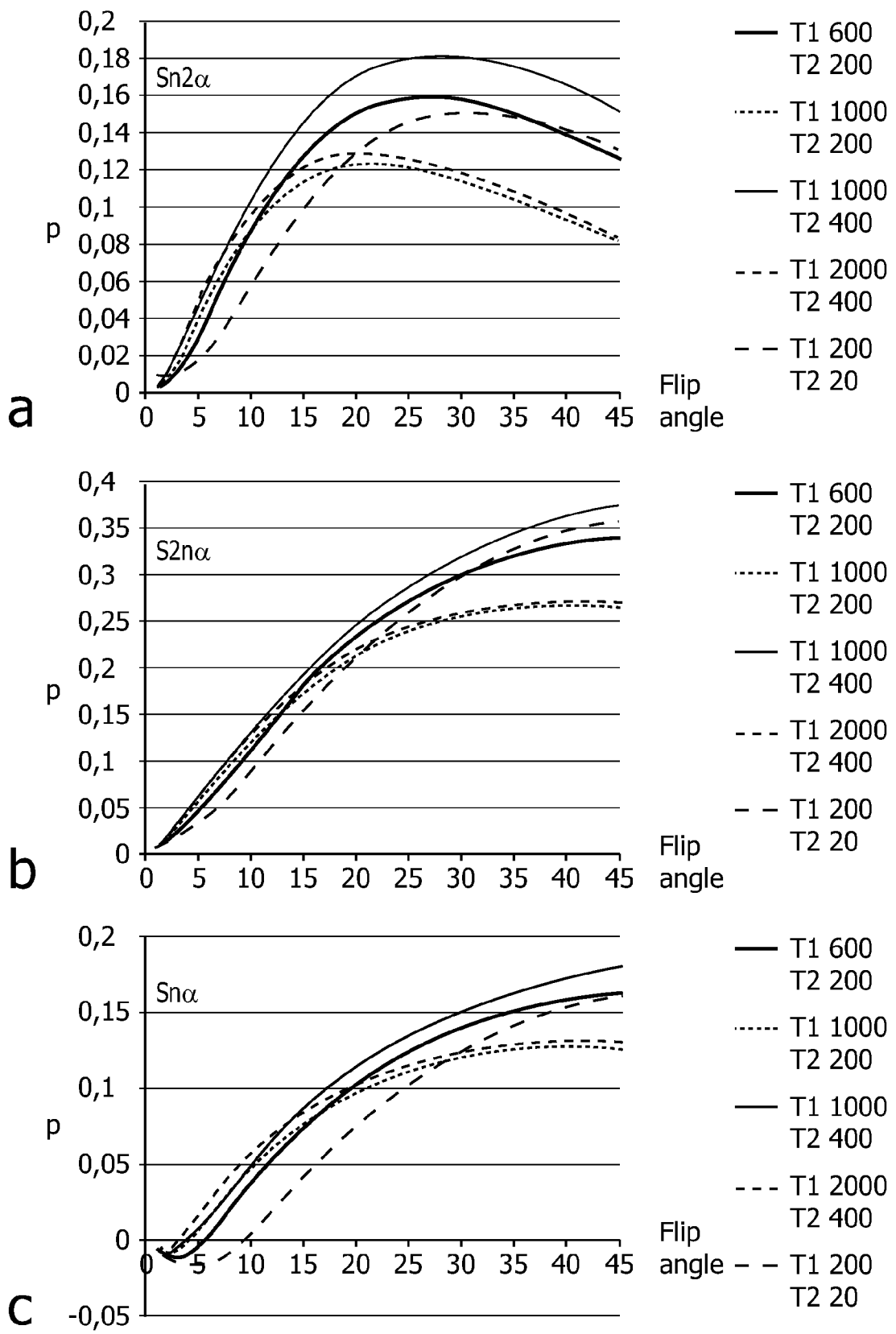
FIG. 2 shows simulations of the difference signals from gradient echo acquisition sequences with and without RF spoiling at a range of flip angles.

FIG. 2 shows simulations of the flip angle of the comparisons between gradient echo acquisition sequences with and without RF spoiling. The difference $S_{n2\alpha}$ shows reasonable about three-fold enhancement when compared to low flip angle of $\alpha=4°-5°$. However it is noted that simulation show that the difference $S_{n2\alpha}$ decreases for very large flip angles in the range $\alpha>20°$. Thus, the detected difference is degenerate in that it may be attributed to a modest increase of the flip angle due RF coupling or to a very large increase of the flip angle due to very strong RF coupling. Notably, the difference $S_{n2\alpha}$ is useful in situations where very strong RF coupling is ruled out, e.g. for tracking of an interventional instrument, such as a catheter. Further, in the range of modest, about three-fold, enhancement, the enhancement is not strongly dependent on the ratio $$\frac{T_1}{T_2},$$

especially for $T>_1 600$ ms, so that the about three-fold enhancement caused by RF coupling is not strongly affected by the surrounding tissue type.

For low values of the flip angle $\alpha$ indeed $S_{n2\alpha} \propto \alpha$, at least for long $$\frac{T_1}{T_2}$$

tends towards zero value for $\alpha<4°-5°$ when there is no RF resonance, i.e. in the absence of an implant. However for short $$\frac{T_1}{T_2},$$

the difference $S_{n2\alpha}$ shows a non-degenerate enhancement up to flip angles $\alpha$ up to about 10°. Accordingly the difference $S_{n2\alpha}$ is suitable to detect implants or track an interventional instrument with high sensitivity with the use of flip angles up to α=10°; very good non-degenerate sensitivity is achieved for modest flip angles in the range α<6°.

The difference $S_{n\alpha}$ is zero at the Ernst angle, so that near the Ernst angle this difference has low power to distinguish the presence of an implant that generates RF coupling. Nevertheless the difference $S_{n\alpha}$ has a modest about three-fold enhancement in the range of flip angles larger than the Ernst angle. Moreover, both the enhancement as well as the Ernst angle are dependent on the ratio $$\frac{T_1}{T_2},$$

i.e. the modest enhancement is dependent on the tissue type. Thus, the difference $S_{n\alpha}$ is nevertheless a useful indication for the presence of an implant when the surrounding tissue is a priori known. For example, the difference $S_{n\alpha}$ is useful for detection of an implant in the patient's brain or for tracking an invasive device, such as a biopsy needle in the patient's brain.

The difference $S_{2n\alpha}$ is monotonously increasing with the flip angle α. That is, the difference $S_{2n\alpha}$ shows strong enhancement when the flip angle increases due to RF coupling, while the difference is small for low flip angle, i.e. when there is no RF coupling. For example, simulations show that difference $S_{2n\alpha}$ shows an enhancement of about an order of magnitude relative the difference at α=4°. Accordingly the difference $S_{2n\alpha}$ is highly sensitive for RF coupling due to the presence of an instrument such as an implant. Further, the difference $S_{2n\alpha}$ effectively nulls the signal differences between FFE and T1FFE for short TR, low flip angle and a wide range of $$\frac{T_1}{T_2}.$$

Thus, the difference $S_{2n\alpha}$ is suitable for detection or tracking of an instrument irrespective of the type of surrounding tissue.

The invention claimed is:

1. A magnetic resonance examination system for examination of an object comprising:
    a RF system to generate a RF transmission field in an examination space configured to receive an object to be examined,
    a gradient system to generate temporary magnetic gradient fields in the examination space,
    a control module including a sequence controller configured to control the RF system and the gradient system to produce RF pulses and magnetic gradient pulses to generate magnetic resonance signals, wherein
        the sequence controller is configured to apply a steady state FFE gradient echo acquisition sequence to the object in the examination space to produce steady state FFE gradient echo signals from the object and a $T_1$-FFE echo acquisition sequence to the object in the examination space to produce $T_1$-FFE echo signals from the object,
        the control module further including an analysis unit configured to detect a difference in the FFE gradient echo signals and the $T_1$-FFE echo signals and
        determine whether a metal instrument is present in the object from the difference in the FFE gradient echo signals and the $T_1$-FFE echo signals.

2. The magnetic resonance examination system as claimed in claim 1, wherein the FFE acquisition sequence and the $T_1$-FFE acquisition sequence are applied in magnetic resonance scan with a flip angle below 10°.

3. The magnetic resonance examination system as claimed in claim 1, wherein the analysis unit is configured to subtract one of:
    twice the FFE gradient echo signal from the $T_1$-FFE echo signal, or
    the $T_1$-FFE echo signal generated at a preset flip angle and the $T_1$-FFE echo signal generated at twice the preset flip angle or
    the RF $T_1$-FFE signal and the FFE gradient echo signal acquired at a flip angle equal to the Ernst angle.

4. A method of examining an object, the method including:
    applying a steady state FFE gradient echo acquisition sequence to the object in an examination space to produce steady state FFE gradient echo signals from the object,
    applying a $T_1$-FFE echo acquisition sequence to the object in the examination space to produce $T_1$-FFE echo signals from the object,
    detecting a difference in the FFE gradient echo signals and the $T_1$-FFE echo signals, and
    detecting whether a metal object is present in the object from the difference in the FFE gradient echo signals and the $T_1$-FFE echo signals.

5. A non-transitory computer-readable medium containing machine executable instructions for execution by a controller, wherein the machine executable instructions comprise instructions for:
    applying a steady state FFE gradient echo acquisition sequence to an object in an examination space to produce steady state FFE gradient echo signals from the object,
    applying a $T_1$-FFE echo acquisition sequence to the object in the examination space to produce $T_1$-FFE echo signals from the object,
    detecting a difference in the FFE gradient echo signals and the $T_1$-FFE echo signals, and
    detecting whether a metal object is present in the object from the difference in the FFE gradient echo signals and the $T_1$-FFE signals.

* * * * *